United States Patent
Krueger et al.

(10) Patent No.: US 10,724,738 B2
(45) Date of Patent: Jul. 28, 2020

(54) ARRANGEMENT OF A COMBUSTOR AND A DEVICE FOR SELECTIVE NON-CATALYTIC REDUCTION AND PULSED INJECTION METHOD

(71) Applicant: General Electric Technology GmbH, Baden (CH)

(72) Inventors: Joerg Krueger, Schwandorf (DE); Sascha Krueger, Bad Berka (DE); Oliver Gohlke, Munich (DE)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 380 days.

(21) Appl. No.: 15/545,237

(22) PCT Filed: Jan. 12, 2016

(86) PCT No.: PCT/EP2016/050444
§ 371 (c)(1),
(2) Date: Jul. 20, 2017

(87) PCT Pub. No.: WO2016/071537
PCT Pub. Date: May 12, 2016

(65) Prior Publication Data
US 2018/0017253 A1    Jan. 18, 2018

(30) Foreign Application Priority Data
Jan. 20, 2015  (EP) ..................... 15151715

(51) Int. Cl.
*F23J 15/00* (2006.01)
*B05B 15/656* (2018.01)
(Continued)

(52) U.S. Cl.
CPC .......... *F23J 15/003* (2013.01); *B01D 53/346* (2013.01); *B01D 53/56* (2013.01); *B01D 53/79* (2013.01);
(Continued)

(58) Field of Classification Search
CPC ......... B08B 7/0007; F28G 7/005; F23C 15/00
(Continued)

(56) References Cited

U.S. PATENT DOCUMENTS 2,701,738 A * 2/1955 Cerasi ...................... B05B 1/265
239/440
3,029,030 A * 4/1962 Dey, Sr. .................. B05B 1/265
239/520
(Continued)

FOREIGN PATENT DOCUMENTS

DE          43 15 385 A1    11/1994
DE    10 2010 050 334 A1    5/2012
(Continued)

OTHER PUBLICATIONS

Extended European Search Report and Opinion issued in connection with corresponding EP Application No. 15151715.8 dated Apr. 22, 2015.
(Continued)

*Primary Examiner* — Grant Moubry
*Assistant Examiner* — John E Bargero
(74) *Attorney, Agent, or Firm* — Armstrong Teasdale LLP

(57) ABSTRACT

The arrangement of a combustor and a device for selective non-catalytic reduction includes a nozzle for injecting a reagent, a control system for controlling the flow from the nozzle, the control system being arranged for generating a pulsed flow from the nozzle.

20 Claims, 6 Drawing Sheets

(51) Int. Cl.
| | |
|---|---|
| *B05B 15/68* | (2018.01) |
| *B01D 53/56* | (2006.01) |
| *B01D 53/79* | (2006.01) |
| *B05B 13/02* | (2006.01) |
| *B05B 13/04* | (2006.01) |
| *B01D 53/34* | (2006.01) |
| *G03F 7/20* | (2006.01) |
| *B05B 1/08* | (2006.01) |
| *B05B 13/06* | (2006.01) |

(52) U.S. Cl.
CPC ............ *B05B 1/08* (2013.01); *B05B 13/0278* (2013.01); *B05B 13/041* (2013.01); *B05B 15/656* (2018.02); *B05B 15/68* (2018.02); *G03F 7/707* (2013.01); *G03F 7/70783* (2013.01); *B01D 2251/2062* (2013.01); *B01D 2251/2067* (2013.01); *B01D 2257/402* (2013.01); *B01D 2257/404* (2013.01); *B01D 2258/0283* (2013.01); *B01D 2259/124* (2013.01); *B05B 13/0627* (2013.01); *F23J 2219/20* (2013.01); *Y02C 20/10* (2013.01)

(58) Field of Classification Search
USPC .......................................... 431/1, 2; 110/215
See application file for complete search history.

(56) References Cited

U.S. PATENT DOCUMENTS

| | | | | |
|---|---|---|---|---|
| 5,453,258 | A * | 9/1995 | Lippmann | B01D 53/56 423/235 |
| 6,988,454 | B2 * | 1/2006 | Marx | F23J 7/00 110/214 |
| 7,670,569 | B2 * | 3/2010 | Higgins | B01D 53/56 422/168 |
| 8,978,364 | B2 * | 3/2015 | Olivier | F02M 51/061 60/295 |
| 2003/0109047 | A1 | 6/2003 | Valentine | |
| 2008/0022663 | A1 * | 1/2008 | Dodge | F01N 3/2066 60/286 |
| 2012/0177553 | A1 | 7/2012 | Lindemann et al. | |
| 2017/0157636 | A1 * | 6/2017 | Wright | B05B 15/68 |

FOREIGN PATENT DOCUMENTS

| | | |
|---|---|---|
| DE | 20 2014 004 495 U1 | 7/2014 |
| EP | 1 256 761 A2 | 11/2002 |
| WO | 2012/059184 A1 | 5/2012 |
| WO | 2014/055858 A1 | 4/2014 |

OTHER PUBLICATIONS

International Search Report and Written Opinion issued in connection with corresponding PCT Application No. PCT/EP2016/050444 dated Mar. 30, 2016.

Machine Translation and First Office Action and Search issued in connection with corresponding CN Application No. 201680000361.3 dated Apr. 5, 2017.

International Preliminary Report on Patentability issued in connection with corresponding PCT Application No. PCT/EP2016/050444 dated Jul. 25, 2017.

* cited by examiner

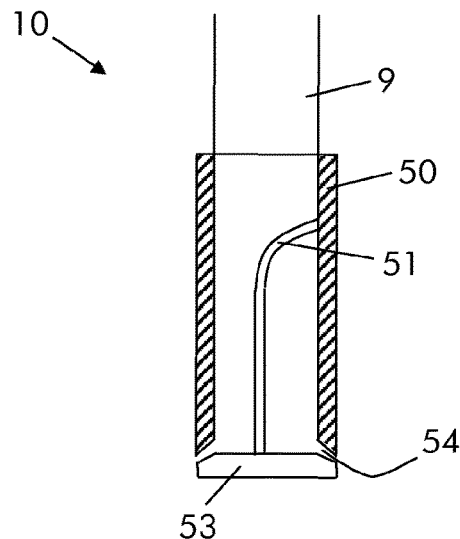
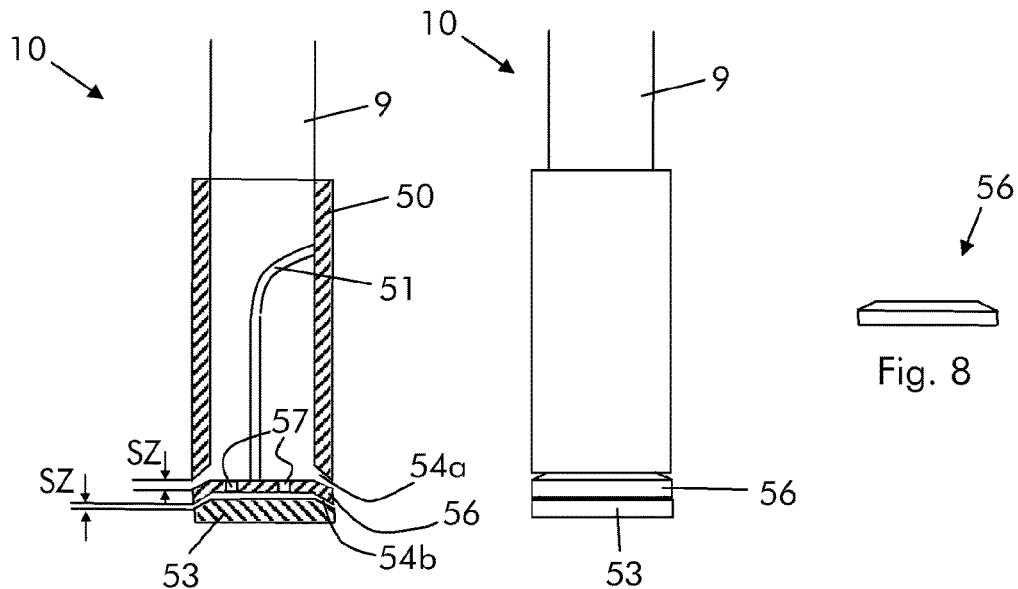
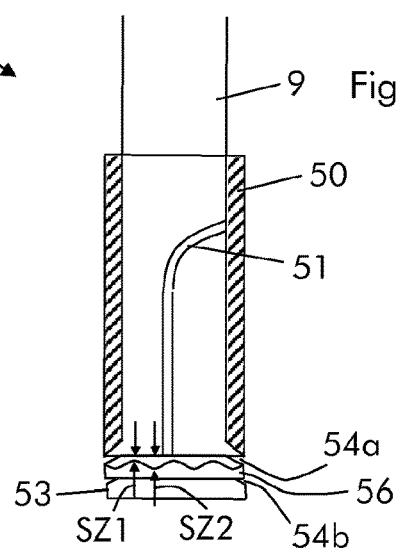

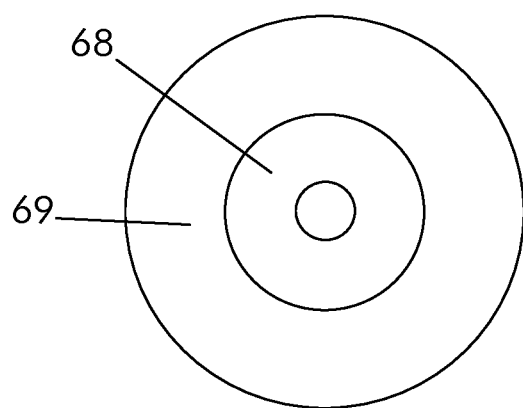
Fig. 13
Fig. 14
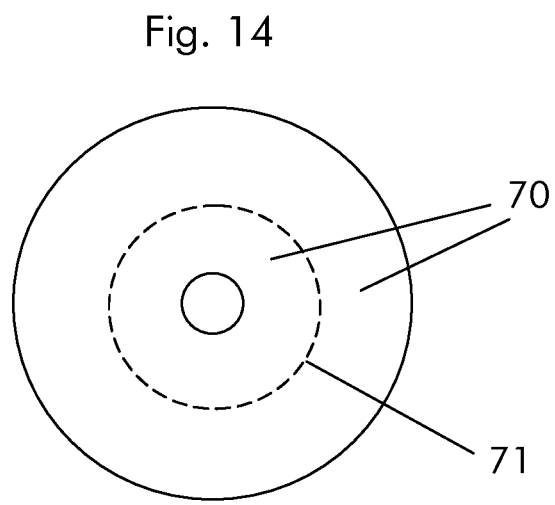

ARRANGEMENT OF A COMBUSTOR AND A DEVICE FOR SELECTIVE NON-CATALYTIC REDUCTION AND PULSED INJECTION METHOD

FIELD OF THE INVENTION

Embodiments of the present invention relate to an arrangement of a combustor and a device for selective non-catalytic reduction and injection method. In particular, embodiments of the present invention refers to a combustor being a boiler, such as a boiler of a power plant for electric power generation; the combustor can anyhow be a different combustor, such as a rotary kiln for cement production. In the following reference to a boiler is made.

BACKGROUND

Boilers comprise tubed walls defining an inner space; a fuel such as coal, oil, waste is supplied into the inner space and is combusted with an oxidizer, such as air or oxygen. During the combustion flue gas is generated that is rich in $NO_x$, whose amount has to be reduced below given limits before the flue gas is vented into the atmosphere.

In order to remove $NO_x$ from the flue gas, a regent such as ammonia ($NH_3$ as liquid solution) or urea ($CH_4N_2O$ as liquid solution) can be injected into the flue gas and the flue gas can be passed through a catalyzer, for the $NO_x$ to be converted into Na and $H_2O$ (selective catalytic reduction, SCR); this reaction occurs at low temperatures, e.g. between 250-450° C.

The catalyst is expensive and can be damaged during operation, for this reason a method has been developed according to which ammonia or urea are injected into the flue gas having a high temperature, e.g. in the range 750-1300° C., such that the $NO_x$ conversion into Na and $H_2O$ occurs without the need of a catalyst (selective non-catalytic reduction, SNCR).

WO2012/059 184 discloses a boiler for waste to energy applications (i.e. waste is used as a fuel in the boiler). The boiler has an aperture at its top wall such that a device for selective non-catalytic reduction is introduced into the inner space through this aperture. The device for selective non-catalytic reduction has a tubular lance and a hose sliding into the lance. The hose has a nozzle at its end housed in the inner space. During operation the lance hangs from the top wall of the boiler and the hose extends from the lance; the reagent passes through the hose and is injected through the nozzles upwards.

The reagent after injection has to evaporate to mix with the flue gas, for the mixture to undergo the selective non-catalytic reaction for $NO_x$ removal. The inventors have found that evaporation occurs in a limited space around the nozzle; it would be beneficial to have a larger evaporation zone for a larger amount of the flue gas to mix with vapor reagent and thus treat a larger portion of flue gas by selective non-catalytic reaction.

SUMMARY OF INVENTION

An aspect of the invention includes providing an arrangement and a method that allow reagent evaporation in a large area around the nozzle.

An embodiment provides an arrangement of a combustor and a device for selective non-catalytic reduction, the device for selective non-catalytic reduction comprising at least a nozzle for injecting a reagent, wherein a control system for controlling the flow from the nozzle, the control system being arranged for generating a pulsed flow from the nozzle.

An embodiment provides a method for injecting a reagent from at least a nozzle of a device for selective non-catalytic reduction into a combustor, by pulse injecting the flow from the at least a nozzle.

BRIEF DESCRIPTION OF THE DRAWINGS

Further characteristics and advantages will be more apparent from the description of a non-exclusive embodiment of boiler, illustrated by way of non-limiting example in the accompanying drawings, in which:

FIGS. 5 through 10 show different embodiments of the nozzle;
FIGS. 13 and 14 show the evaporation areas for different nozzles operated in different ways.

DETAILED DESCRIPTION OF EXEMPLARY EMBODIMENTS

Figure 1:
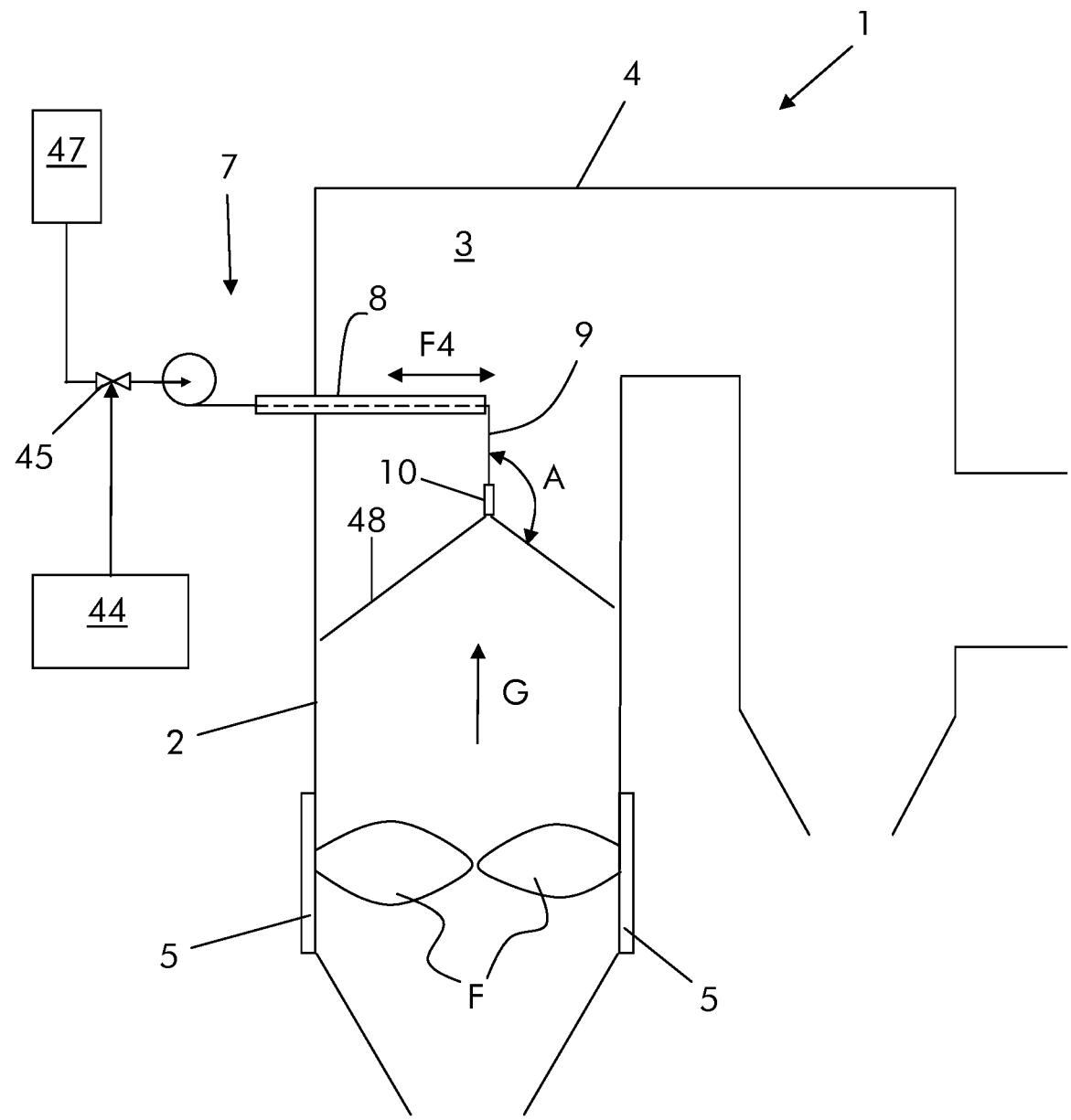
FIG. 1 shows a schematic boiler.

With reference to the figures, these show a combustor being a boiler 1 comprising side tubed walls 2 enclosing an inner space 3 and a top wall 4. The boiler is supplied with fuel such as coal (but other kinds of fuel such as waste, oil, gas, etc. are possible) and an oxidizer such as air or oxygen via burners 5.

The boiler also has a device 7 for selective non-catalytic reduction SNCR; the device 7 comprises a lance 8 carrying a hose 9 having at least a nozzle 10; as shown. In an embodiment the nozzle is at the hose terminal part that is housed within the inner space 3. The device 7 further has a hose drive mechanism 11 for driving the hose within the lance 8.

The figures show an example of a 2-pass boiler and in this case the device 7 is associated to the first pass, it is anyhow clear that the boiler can be any type of boiler and the device 7 can be located anywhere, at locations where temperatures for correct selective non-catalytic reaction exist.

In an embodiment, the lance 8 protrudes into the inner space 3 from a side tubed wall 5 of the boiler. This way the length of the hose housed within the inner space 3 is shorter than in case the lance was hanging from the top wall 4 of the boiler, such that the reagent passing through the hose during operation does not evaporate or at least does not undergo evaporation to a large extent before it reaches the nozzle 10. In an embodiment the lance 8 protrudes substantially horizontally.

Figure 2:
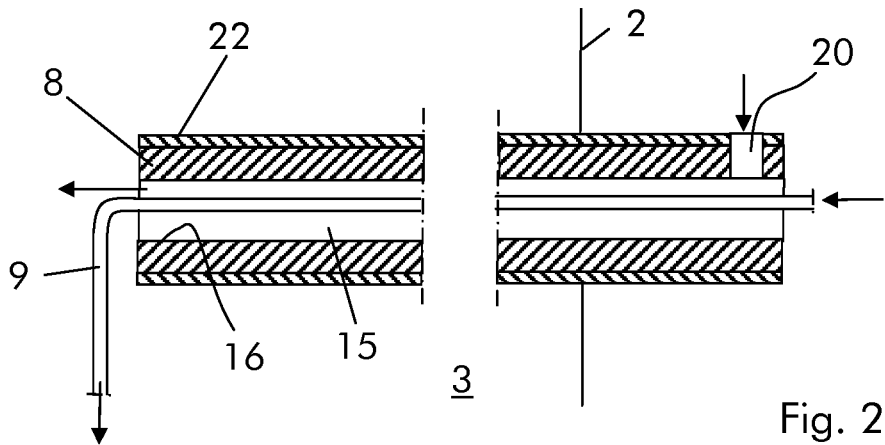
FIGS. 2 through 4 show different embodiments of the lance.
Figure 3:
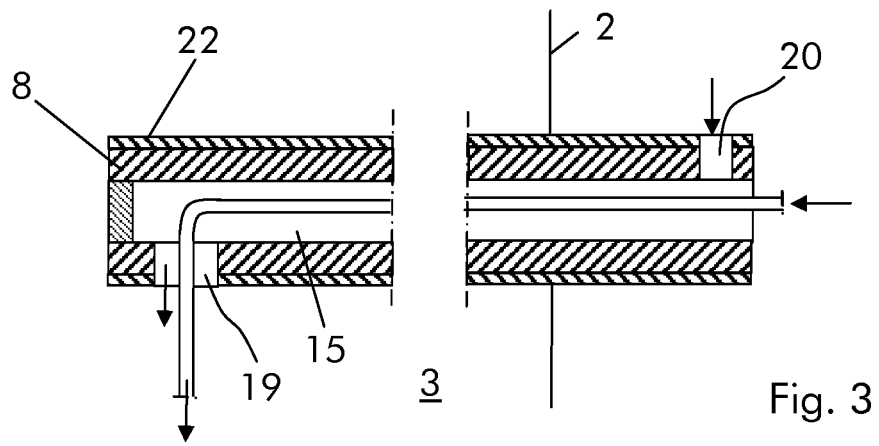
Figure 4:
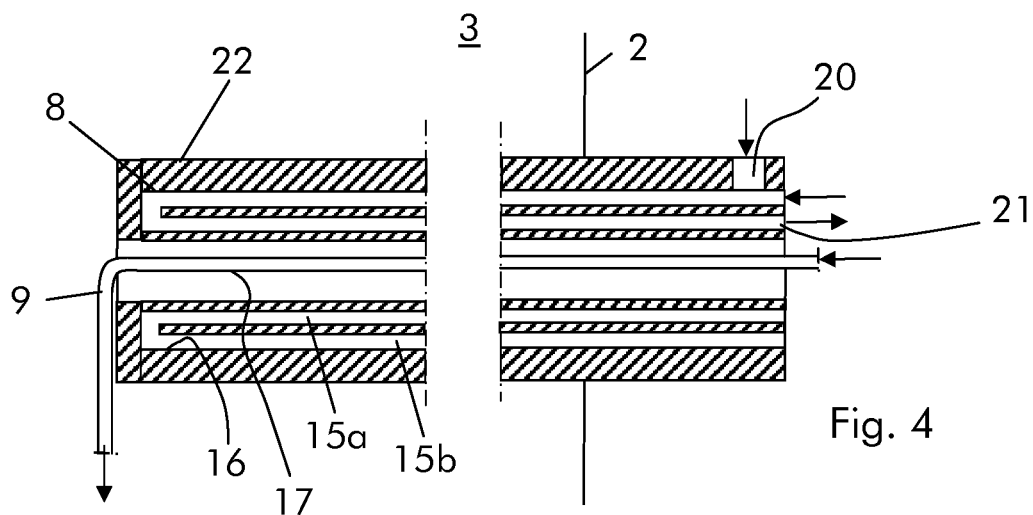

In order to further counteract the evaporation of the reagent, the lance 8 is provided with a cooling system, in an embodiment; FIGS. 2 through 4 show lances 8 with different cooling systems.

The cooling system comprises one or more channels 15 for a cooling medium such as air and/or another gas and/or steam and/or water. In an embodiment the channels 15 have an annular shape and are located between a lance wall 16 and the hose 9. For example, FIG. 2 shows a lance 8 with the hose 9 projecting from its open end; one annular channel 15 is defined between the wall 16 of the lance 8 and the hose 9. FIG. 3 shows a lance 8 having an opening 19 and the hose 9 projecting from this opening 19; one annular channel 15 is defined between the wall 16 of the lance 8 and the hose 9. FIG. 4 shows a lance 8 with the hose 9 projecting from its open end; two annular channels 15a, 15b are defined between the wall 16 of the lance 8 and the hose 9.

An inlet 20 into the channels 15, 15a, 15b for the cooling medium is located at a portion of the lance 8 outside the inner space 3 (FIGS. 2-4); in contrast, an outlet from the channels 15, 15a, 15b can be located at a portion of the lance 8 inside the inner space 3 (FIGS. 2 and 3) and can be defined by the opening 19 and/or the outlet can be located at a portion of the lance 8 outside the inner space 3 (FIG. 4) and can be defined by a dedicated opening 21.

In addition, the lance 8 can have an outer insulation layer 22 for thermally insulating the lance and protecting it against the flue gas. The outer insulation layer 22 is implemented if needed according to the heat removal capacity of the cooling system.

In case the cooling medium is air and/or another gas: when the air/other gas has a low pressure (for example air/other gas are supplied into the channels 15, 15a, 15b via a blower) the insulation layer 22 is typically needed; when the air/other gas has a medium pressure (for example air/other gas are supplied into the channels 15, 15a, 15b via a blower) the insulation layer 22 is typically not needed because the increased pressure of the air/other gas allows a sufficient heat removal; when the air/other gas has a high pressure (for example air/other gas are supplied into the channels 15, 15a, 15b via a compressor) the insulation layer 22 is typically not needed.

When the cooling medium is air/other gas it can be discharged into the inner space 3 of the boiler (i.e. the lance 8 can have the structure shown in FIG. 2 or 3); in fact, the air can allow further reaction of the fuel (i.e. it can act like overfire air).

In case the cooling medium is water it can be supplied to the channels 15, 15a, 15b at medium pressure typically without any need of outer insulating layer 22; in this case the water can be discharged either within the inner space 3 (like in FIGS. 2 and 3) or outside of the inner space 3 (like in FIG. 4).

In case the cooling medium is steam: it can be supplied into the channels 15, 15a, 15b at low pressure, typically without any need of the outer insulating layer 22; in this case the steam is discharged into the inner space 3 (like the lance shown in FIGS. 2 and 3); or it can be supplied to the channels 15, 15a, 15b at high pressure, typically without any need of the outer insulating layer 22; in this case the steam is discharged outside of the inner space 3 (like the lance shown in FIG. 4).

Naturally the specific design of the lance, the presence of the outer insulating layer and the location of the inlet 20 and outlet, the configuration of the channels 15, 15a, 15b, the type of cooling means and the pressure of the cooling means can be any combination and will depend on the particular conditions.

In an embodiment the lance 8 is provided with a lance positioning system for regulating the position of the hose 9 within the inner space 3. In particular, the lance positioning system is arranged for regulating the position of the lance over its longitudinal axis 25.

In one embodiment, the lance positioning system for regulating the position of the lance over its longitudinal axis comprises a lance support beam 26 and a chariot 27 movable on the support beam 26; the lance 8 is connected to the chariot 27.

According to an embodiment, drum 29 is also provided for carrying the hose 9; in further embodiments the drum 29 is not connected to the chariot 27; it can for example be connected to and supported by the support beam 26 or an external support.

The chariot 27 further supports the hose drive mechanism 11. The hose drive mechanism 11 has opposing wheels 31 through which the hose 9 passes through and a motor 32 for driving the wheels 31, such that during operation the wheels 31 drive the hose 9 and the drum 29 is only used to wind or unwind the hose 9. A drive system for example with a chain 36 and a motor 37 is used to drive the chariot 27 along the support beam 26. In this respect the chariot 27 is fixed to the chain 36 at a position 38.

Additionally, the support beam could also have a hinge 40 and a side drive mechanism for example comprising a chain 41 having the ends connected to the support beam 26 and wheels 42; at least one of the wheels 42 is connected to a motor 43 for controlling and adjusting the side position over the arrows S.

The boiler 1 further has a control system 44 for controlling the flow from the nozzle 10. In an embodiment, the control system 44 can be arranged for generating a pulsed flow from the nozzle 10. For example, the boiler can have one or more valves 45 connected to and driven by the control system 44 for generating the pulsed flow. In addition or as an alternative the reagent can be supplied via a pump that is controlled in order to provide the pulsed flow. Other means for generating the pulsed flow are naturally possible.

The operation of the boiler is apparent from that described and illustrated and is substantially the following.

Fuel and oxidizer are supplied into the inner space 3 and the fuel is combusted generating flames F and flue gas G that passes through the boiler. The flue gas contains $NO_x$ (mainly NO and lower amounts of $NO_2$) that has to be at least partly removed.

The lance 8 is introduced into the inner space 3, e.g. through a side opening of the side tubed wall 2 (but this is not mandatory and the lance can be introduced into the inner space from e.g. the top wall 4 of the boiler); the opening can be an opening for different scopes, such as an inspection opening or a dedicated opening.

From the lance 8 the hose 9 and the nozzle 10 hang in the inner space 3.

The nozzle position can be adjusted both horizontally and vertically.

The nozzle position is adjusted vertically for the nozzle 10 to inject the reagent in zones where the temperature is the best for selective non-catalytic reaction. The vertical adjustment can be done by operating the motor 32 in order to drive the wheels 31 for pushing/pulling the hose 9 through the lance 8 as indicated by arrow F1 and regulating the nozzle vertical position as indicated by the arrow F2.

The nozzle position is adjusted along the axis 25 (for example horizontally) to place the nozzle 10 in zones where the flue gas velocity (and thus the mass flow) is higher, because the most of the $NO_x$ passes through these zones. The nozzle position can be horizontally regulated along the support beam 26 by operating the motor 37 in order to drive the chariot 27 along the support beam 26 as indicated by the arrow F3. The movement of the chariot 27 causes the corresponding movement of the lance 8 along the support beam 26 as indicated by the arrow F4.

Additionally, the nozzle position can also be pivotally adjusted. This is often not needed because in particular for large boilers more than one lance are provided; anyway side adjustment could render regulation more flexible. In this case the regulation can be done by operating the motor 43 in order to move the chain 41 as indicated by the arrows F5 and thus pivot the support beam 26 (and the lance 8 supported by it) as indicated by the arrows S.

The position of the nozzle can be adjusted before the boiler is started, according the foreseeable operating conditions, but can also be changed during operation of the boiler, in response to changed operating conditions or to betted adapt the nozzle position to the current operating conditions and/or temperature distribution and/or flue gas velocity distribution.

During operation of the boiler 1, the hose 9 is supplied with a reagent such as ammonia or urea from a tank 47; the reagent passes through the hose 9 and is injected via the nozzle 10.

Different possibilities are available for the injection. In an embodiment, the reagent is injected over a conical surface 48 for example via a slot, but it can also be injected via a plurality of single jets each resting on a conical surface. In an embodiment the angle A between the hose 9 and the flow injected through the nozzle 10 is in the range 0°<A<180°, more particularly it is in the range 90°<A<180° and more particularly it is in the range 135°<A<155°.

Figure 11:
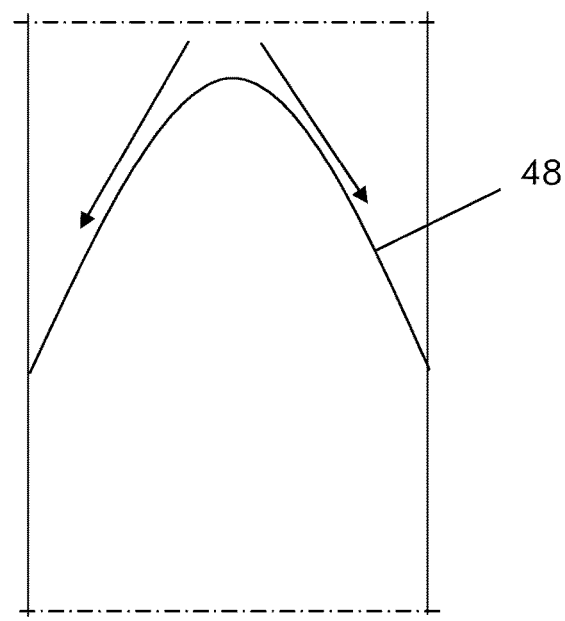
FIG. 11 shows an isothermal curve within the inner space of the boiler (above the flame)

An injection over a conical surface 48 defining an angle A between 90°-180° and 135°-155° in an embodiment which can be advantageous because it allows to a spray of the reagent over areas where the temperature is uniform. In fact, the temperature within the inner space 3 is lower close to the side tubed walls 2 and it is lower upwards (i.e. apart from the flame); therefore the isothermal curve has a bell shape with ends directed downwards and close to the tubed side walls 2 (FIG. 11). Therefore injection over a conical surface with apex at the top and directed downwards allows the reagent to intersect the flue gas having a substantially uniform or more uniform temperature than with other configurations.

FIGS. 5 through 10 show different embodiments of the nozzle 10.

FIG. 5 shows an embodiment in which the nozzle 10 has a body 50 (in an embodiment tubular in shape) for example made out of steel or other metal with a support arm 51 connected in it. One end of the nozzle 10 is connected to the hose 9 and the other end has an occlusion 53 connected to the support arm 51. The occlusion 53 defines together with the body 50 a slit 54. The slit 54 can have (but this is not mandatory) a convergent passage area from the inside of the body 50 to the outside thereof. During operation the reagent passes through the hose 9 and enters the body 50; then the reagent is injected into the inner space 3 of the boiler via the slit 54.

FIGS. 6 through 8 show a different embodiment of the nozzle 10. Also in this embodiment, the nozzle 10 has a body 50 with a support arm 51 that supports one or more (in the example shown only one) intermediate discs 56 and the occlusion 53. The discs 56 are provided with openings 57 for the passage of the reagent. The disc 56 defines with the body 50 a first slit 54a and with the occlusion 53 a second slit 54b; the slits 54a and 54b can have the same size SZ. However, further embodiments have different size SZ, such that the reagent injected through them forms droplets of different diameter that evaporate in different parts of the boiler (smaller droplets evaporate faster), in order to better distribute the reagent within the inner space 3. Naturally also more than one disc and thus more than two slits are possible.

FIGS. 9 and 10 show a further example of the nozzle; in this embodiment the disc 56 has an outer border 59 that is not straight (like in the previous examples) but has a zig-zag or curved shape; the size of the slit changes over the border 59 from a minimum size SZ1 to a maximum size SZ2.

Naturally also embodiments with solutions combining those described above are possible, such that for example the zig-zag border can be provided only at the occlusion 53 or at both the disc 56 and occlusion 53 or instead of or in addition to the outer border 59, also the inner border 60 can have a zig-zag shape.

In addition or as an alternative to the nozzle features (e.g. numbers of slits and/or their configuration), the reagent distribution and evaporation can also be improved by the pulsed injection, controlled via the control system 44 and valves 45.

Figure 12:
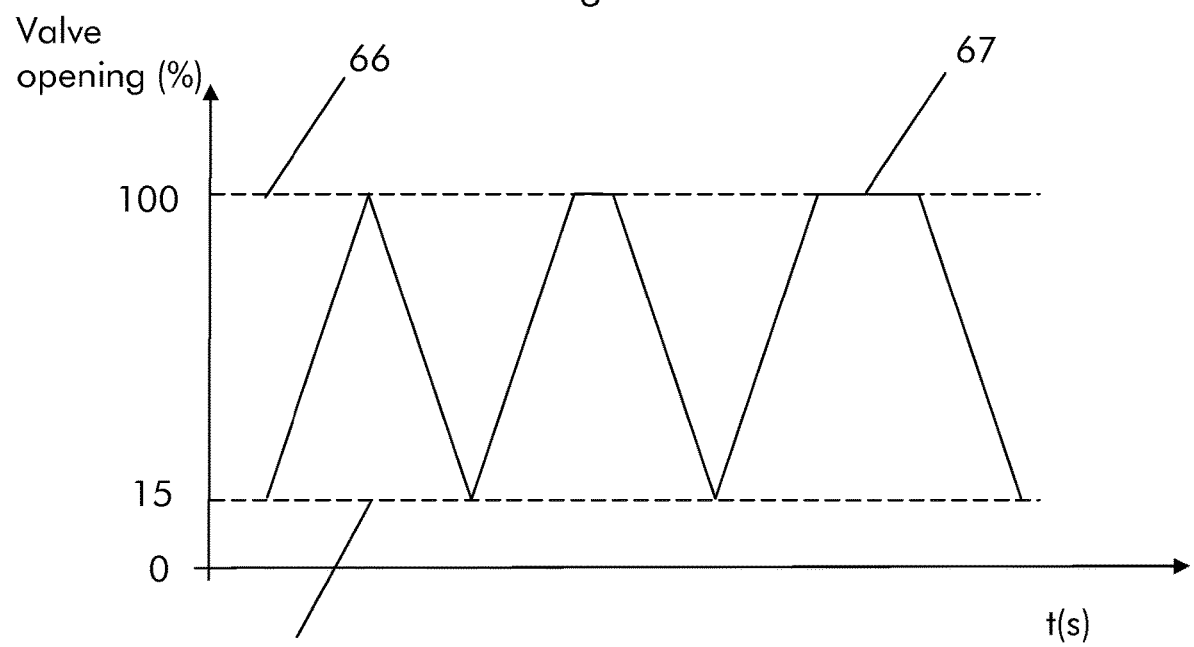
FIG. 12 shows the valve opening-time relationship for a pulsing injection of reagent.
Figure 15:
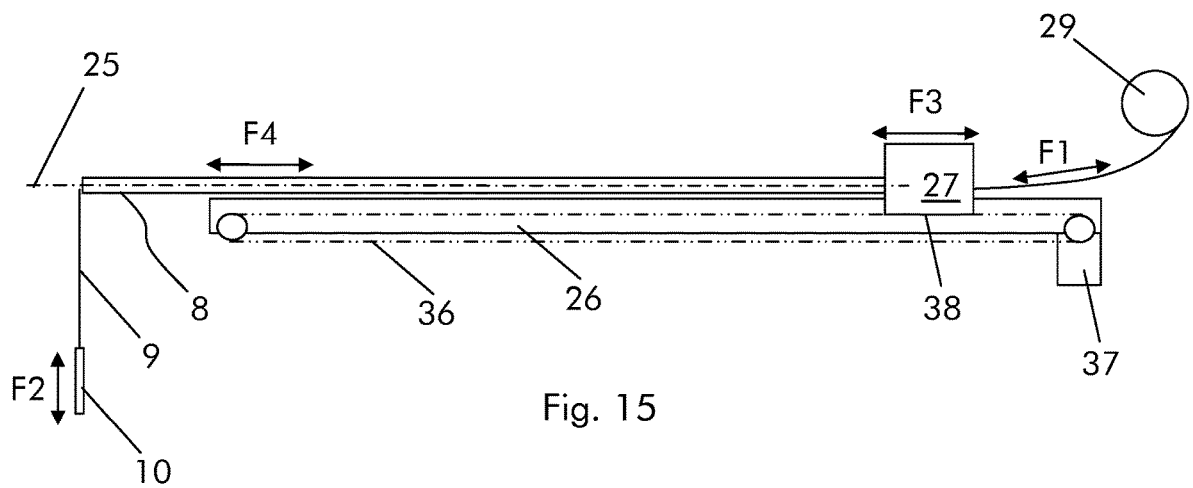
FIG. 15 shows a lance connected on a support beam.
Figure 16:
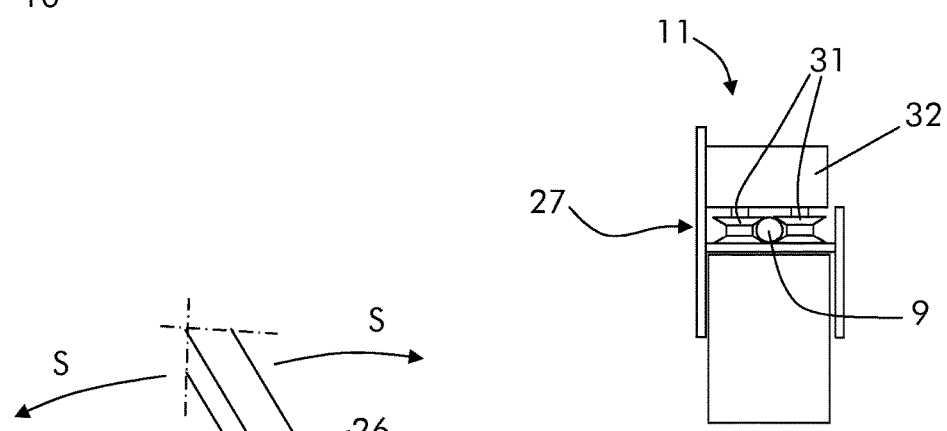
FIG. 16 shows a chariot connected to a support beam.
Figure 17:
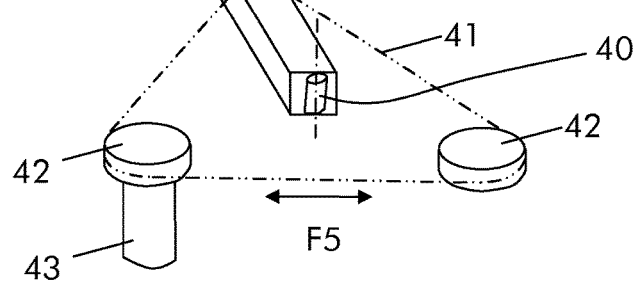
FIG. 17 shows an embodiment of a support beam with side position regulation.

FIG. 12 shows a relationship between the valve opening and time; it is clear that the minimum valve opening 65, the maximum valve opening 66, the duration of maximum opening 67 and the ramp frequency can be set according to the needs. In an embodiment, pulsation has a frequency between 0.1-10 Hz.

During operation, because of the varying volume flow, the exit velocity from the slits increases and/or decreases, this causes a change in the diameter of the reagent droplets. Droplets of different diameter evaporate differently such that with pulsing injection it is possible to achieve a larger evaporation zone than without it.

As a matter of example, FIGS. 13 and 14 show a view from the top of the area where the reagent droplets evaporate within the inner space 3; FIG. 13 refers to a nozzle embodiment with different slits 54a, 54b (for example the nozzle can have a configuration as shown in FIGS. 6-8) and FIG. 14 refers to a nozzle embodiment with pulsed reagent injection (for example the nozzle can have a configuration as shown in FIG. 5).

From FIG. 13 it is apparent that the droplets having a smaller diameter (e.g. injected through the slit 54b) evaporate faster than the droplets having a larger diameter (e.g. injected through the slit 54a). In this respect the annular area 68 indicates the zone where the droplets of smaller diameter evaporate and the area 69 indicate the zone where the droplet of larger diameter evaporate. From FIG. 13 it is apparent that the two (and possibly more than two) slits allow evaporation over a much larger area than in case only one slit is used.

FIG. 14 shows the zone 70 where evaporation of the reagent droplets occurs; also in this case it is apparent that the evaporation with pulsed injection is much larger than without pulsed injection; as an example line 71 indicates the possible evaporation starting point in case no pulsation is used.

After injection and evaporation, the reagent mixes with the flue gas and carries out the known selective non-catalytic reaction to at least partly remove $NO_x$ from the flue gas.

Embodiments of the present invention also refer to a method for injecting a reagent from a nozzle of a device for selective non-catalytic reduction 7 into a combustor. The method comprises pulse injecting the flow from the nozzle 10.

The combustor has a control system 44 and one or more valves 45 intercepting the flow directed to the nozzle 10, according to the method, the control system 44 controls the valve 45 for pulse injecting the flow from the nozzle 10. In addition, the flow is injected with an angle A between the hose 9 and the injected flow in the range 0°<A<180°, particularly in the range 90°<A<180° and more particularly in the range 135°-155°.

Naturally the features described may be independently provided from one another.

In practice the materials used and the dimensions can be chosen at will according to requirements and to the state of the art.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A combustor comprising
    a device for selective non catalytic reduction, the device for selective non-catalytic reduction comprising a nozzle for injecting a reagent, the nozzle comprising a body defining an internal cavity and an end member at least partially closing the cavity, the end member comprising:
        an occlusion;
        an arm coupling the occlusion to the body; and
        an intermediate body coupled to the occlusion and positioned between the occlusion and the body, the body and the intermediate body cooperatively defining a slit for the reagent to exit the nozzle therebetween and enter the combustor, the intermediate body defining an opening oriented to direct at least a portion of the reagent through the intermediate body and in contact with the occlusion, wherein the end member defines an additional slit for the reagent to exit the nozzle between the intermediate body and the occlusion, and wherein the intermediate body comprises a peripheral edge having an undulating shape such that the size of at least one of the slit and the additional slit varies circumferentially about the end member; and
    a control system for controlling the flow from the nozzle the control system being arranged for generating a pulsed flow of the reagent from the slit to produce different sized reagent droplets within the combustor.

2. The combustor of claim 1, further comprising a valve connected to and driven by the control system.

3. The combustor of claim 1, wherein the combustor is a boiler having side tubed walls enclosing an inner space.

4. The combustor of claim 3, wherein the device for selective non catalytic reduction comprises a lance carrying a hose having the nozzle and a hose drive mechanism for driving the hose within the lance.

5. The combustor of claim 4, wherein the lance protrudes into the inner space from a side tubed wall of the boiler.

6. The combustor of claim 4, wherein the nozzle is arranged for injecting the flow with an angle A between the hose and the flow injected through the nozzle in the range $0°<A<180°$.

7. The combustor of claim 6, wherein the angle A is in the range $90°<A<180°$.

8. The combustor of claim 6, wherein the angle A is in the range $135°-155°$.

9. A method for injecting a reagent from a nozzle of a device for selective non catalytic reduction into a combustor, the nozzle including a body defining an internal cavity and an end member at least partially closing the cavity, the end member including an occlusion, an arm coupling the occlusion to the body, and an intermediate body coupled to the occlusion and positioned between the occlusion and the body, the body and the intermediate body cooperatively defining a slit for the reagent to exit the nozzle therebetween and enter the combustor, the intermediate body defining an opening oriented to direct at least a portion of the reagent through the intermediate body and in contact with the occlusion, wherein the end member defines an additional slit for the reagent to exit the nozzle between the intermediate body and the occlusion, and wherein the intermediate body includes a peripheral edge having a corrugated shape such that the size of at least one of the slit and the additional slit varies circumferentially about the end member, the method comprising:
    injecting, by pulse, the flow through the slit to exit the nozzle.

10. The method of claim 9, wherein the combustor has a control system and a valve intercepting the flow directed to the nozzle, wherein the control system controls the valve for pulse injecting the flow from the nozzle.

11. The method of claim 9, wherein
    the device for selective non-catalytic reduction comprises a lance carrying a hose having the nozzle and a hose drive mechanism for driving the hose within the lance,
    the method further comprising injecting the flow with an angle A between the hose and the injected flow in the range $0°<A<180°$.

12. The method of claim 11, wherein the angle A is in the range $90°<A<180°$.

13. The method of claim 9, wherein the pulse injecting with a frequency between 0.1-10 Hz.

14. The combustor of claim 1, wherein the slit and the additional slit are the same size.

15. The combustor of claim 1, wherein the slit and the additional slit have different sizes.

16. A combustor comprising
    a device for selective non catalytic reduction, the device for selective non-catalytic reduction comprising a nozzle for injecting a reagent, the nozzle comprising:
        a body defining an internal cavity; and
        an end member at least partially closing the cavity, the end member comprising an occlusion and an arm coupling the occlusion to the body, the body and the end member cooperatively defining a slit for the reagent to exit the nozzle therebetween and enter the combustor, wherein the occlusion comprises a peripheral edge having an undulating shape such that the size of the slit varies circumferentially about the end member; and
    a control system for controlling the flow from the nozzle the control system being arranged for generating a pulsed flow of the reagent from the slit to produce different sized reagent droplets within the combustor.

17. The combustor of claim 16, further comprising a valve connected to and driven by the control system.

18. The combustor of claim 16, wherein the combustor is a boiler having side tubed walls enclosing an inner space.

19. The combustor of claim 18, wherein the device for selective non catalytic reduction comprises a lance carrying a hose having the nozzle and a hose drive mechanism for driving the hose within the lance.

20. The combustor of claim 19, wherein the lance protrudes into the inner space from a side tubed wall of the boiler.

* * * * *